US007256997B2

(12) United States Patent
Chen et al.

(10) Patent No.: US 7,256,997 B2
(45) Date of Patent: Aug. 14, 2007

(54) HEAT DISSIPATING DEVICE HAVING A FAN DUCT

(75) Inventors: Chun-Chi Chen, Tu-Cheng (TW); Yi-Qiang Wu, Shenzhen (CN); Gen-Ping Deng, Shenzhen (CN)

(73) Assignees: Fu Zhun Precision Industry (Shenzhen) Co., Ltd., Shenzhen, Quangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/265,400

(22) Filed: Nov. 1, 2005

(65) Prior Publication Data

US 2007/0097633 A1    May 3, 2007

(51) Int. Cl.
*H05K 7/20*        (2006.01)
(52) U.S. Cl. .................. 361/697; 361/690; 361/692; 361/695; 174/15.1
(58) Field of Classification Search ............... 361/690, 361/692, 695, 697; 174/15.1
See application file for complete search history.

(56) References Cited

U.S. PATENT DOCUMENTS

| 5,884,692 | A  | * | 3/1999  | Lee et al. .............. 165/80.3 |
| 5,943,210 | A  | * | 8/1999  | Lee et al. .............. 361/697 |
| 6,062,301 | A  | * | 5/2000  | Lu ..................... 165/80.3 |
| 6,304,445 | B1 |   | 10/2001 | Bollesen |
| 6,542,364 | B2 | * | 4/2003  | Lai et al. .............. 361/697 |
| 6,711,016 | B2 |   | 3/2004  | Chung et al. |
| 6,779,595 | B1 | * | 8/2004  | Chiang ................ 165/104.33 |
| 6,832,410 | B2 |   | 12/2004 | Hegde |
| 6,860,321 | B2 | * | 3/2005  | Ji-Hai et al. .......... 165/80.3 |
| 6,915,844 | B2 | * | 7/2005  | Chou ................. 165/104.33 |
| 6,967,845 | B2 | * | 11/2005 | Chiang et al. .......... 361/709 |
| 7,021,368 | B2 | * | 4/2006  | Lin et al. ............. 165/104.33 |
| 7,040,389 | B2 | * | 5/2006  | Hsu .................... 165/185 |
| 7,073,568 | B2 | * | 7/2006  | Chen et al. ........... 165/104.33 |
| 7,089,999 | B1 | * | 8/2006  | Wu et al. ............. 165/80.3 |
| 7,130,192 | B2 | * | 10/2006 | Wang et al. ........... 361/697 |
| 7,139,171 | B2 | * | 11/2006 | Wang et al. ........... 361/695 |
| 2003/0137807 | A1 |  | 7/2003  | Chen |
| 2003/0210526 | A1 |  | 11/2003 | Huang et al. |

(Continued)

FOREIGN PATENT DOCUMENTS

CN            2632851 Y        8/2004

*Primary Examiner*—Jayprakash Gandhi
*Assistant Examiner*—Anthony M Haughton
(74) *Attorney, Agent, or Firm*—Morris Manning & Martin LLP; Tim Tinkgkang Xia, Esq.

(57) ABSTRACT

A heat dissipating device (8) for cooling a number of electronic devices. The heat dissipating device includes a heat sink (7), a fan (6) mounted to a side of the heat sink and a fan duct (5). The heat sink includes a heat spreader (70), a cover (74) and fins (72) disposed between the heat spreader and the cover. The fan duct includes a mounting plate (50), a faceplate (52) extending downwardly from and perpendicular to the mounting plate, and baffle walls (506, 508) extending downwardly from the mounting plate. The mounting plate defines locating holes (540) for permitting screws (82) to pass through the locating holes and to engage with threaded holes (740) defined in the cover. An airflow generated by the fan flows through the fins and an outlet (524) defined between the baffle walls and the heat sink.

18 Claims, 5 Drawing Sheets

U.S. PATENT DOCUMENTS

2004/0246677 A1* 12/2004 Chen .......................... 361/697
2006/0137861 A1*  6/2006 Wang et al. ........... 165/104.33
2006/0221570 A1* 10/2006 Yang et al. .................. 361/697
2006/0238979 A1* 10/2006 Liu ............................ 361/699

* cited by examiner

HEAT DISSIPATING DEVICE HAVING A FAN DUCT

BACKGROUND

1. Field

The present invention relates to a heat dissipating device having a fan duct to guide an airflow flowing from a fan to electronic devices in a computer system, wherein the fan duct also functions as a fan cover for mounting the fan to a heat sink of the heat dissipating device.

2. Prior Art

A central processing unit (CPU) mounted on the motherboard in a computer is the operation center of the computer. During the operation of the computer, the CPU produces heat. The heat must be quickly carried away from the CPU during the operation of the computer. Excessively high temperature causes the CPU unable to work normally. Various cooling means have been developed for dissipating heat from the CPU of a computer. However, except the CPU, a MOSFET (Metal Oxide Semiconductor Field Effect Transistor) near to the CPU is also a source of heat that needs to be cooled. The MOSFET on the motherboard regulates and provides the power for the CPU. The MOSFET delivers the heat to the motherboard and causes the motherboard temperature to increase quickly, thus shortening the life span of the motherboard.

Conventionally, a heat sink is mounted on the CPU inside a computer. A fan is directly mounted to the heat sink for facilitating removal of heat from the CPU. The fan generates a current of air flowing through the heat sink, to promote heat dissipation into the surrounding air. Examples of conventional heat dissipating devices are disclosed in U.S. Pub. No. 20030137807 A1 and U.S. Pat. No. 6,832,410 B2. The difference between the two heat dissipating devices is the positions of heat sinks relative to fans. The fan is disposed on the heat sink in the U.S. Pub. No. 20030137807 A1 while the fan is connected with a side of the heat sink in the U.S. Pat. No. 6,832,410 B2. Regardless of the mounting positions of the fans, the two prior heat dissipating devices only dissipate the heat generated by the CPU, but can not dissipate the heat generated by the MOSFET beside the CPU because the air flow generated by the fan is not guided to blow the MOSFET.

Thus, it is desired to devise a heat dissipating device which can not only dissipate the heat generated by the CPU but also dissipate the heat by other electronic components beside the CPU.

SUMMARY

Accordingly, what is needed is a heat dissipating device which removes heat from a plurality of heat-generating electronic devices rapidly and has a satisfactory heat dissipation effect.

According to an embodiment of the present invention, a heat dissipating device is proposed for cooling a number of electronic devices. The heat dissipating device comprises a heat sink, a fan duct mounted on the heat sink and a fan mounted on the fan duct and located at a side of the heat sink. The heat sink comprises a heat spreader, a cover and fins disposed between the heat spreader and the cover. The fan duct comprises a mounting plate, a faceplate extending downwardly from and perpendicular to the mounting plate, and baffle walls extending downwardly from the mounting plate. The mounting plate defines locating holes for permitting screws to pass through the locating holes and to engage with threaded holes defined in the cover. The mounting plate forms supporting rods extending downwardly from a bottom thereof for supporting the fan duct on the heat sink. The faceplate comprising a mounting face for the fan being mounted thereon and a central opening for an air flow generated by the fan therethrough. The baffle wall and the heat sink form an outlet through which the air flow generated by the fan directly flows. The air flow also flows through channels between the fins of the heat sink.

Other advantages and novel features of the present invention will become more apparent from the following detailed description when taken in conjunction with the accompanying drawings, in which:

DETAILED DESCRIPTION OF THE PREFERRED EMBODIMENTS

Figure 1:
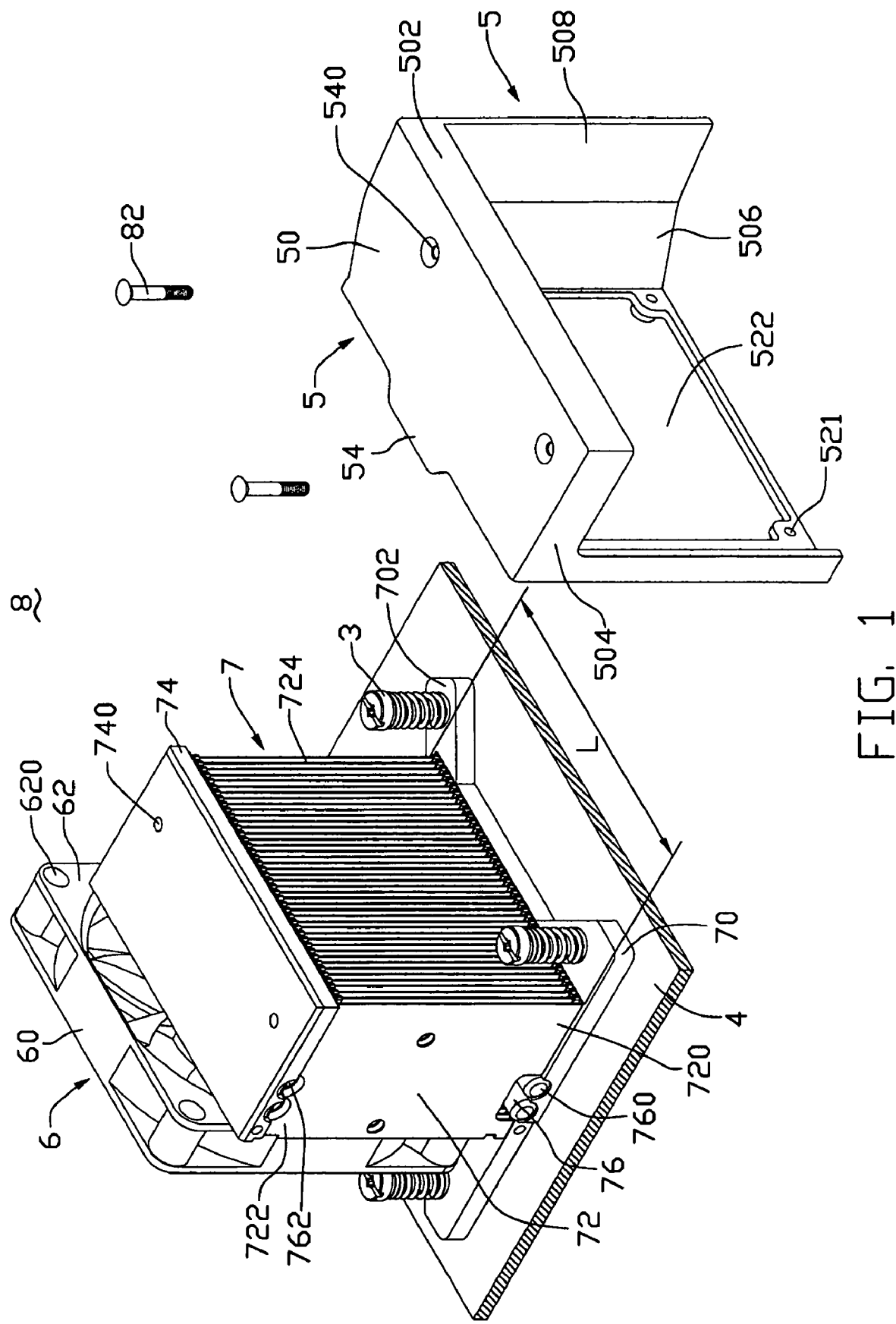
FIG. 1 is a partly exploded view of a heat dissipating device in accordance with a first preferred embodiment of the present invention.

Reference will now be made to the drawing figures to describe a heat dissipating device having a fan duct in accordance with a preferred embodiment of the present invention in details.

FIG. 1 shows a heat dissipating device 8 comprising a heat sink 7, a fan 6 and a fan duct 5. The heat sink 7 is mounted on a printed circuit board 4 (PCB) and comprises a heat spreader 70, a cover 74 parallel to the heat spreader 70 and a plurality of fins 72 disposed between the heat spreader 70 and the cover 74. The heat spreader 70 forms four ears 702 extending outwardly from four corners of the heat spreader 70, respectively. The heat spreader 70 thermally engages with a CPU (not shown) mounted on the PCB 4 by extending four fasteners 3 through the four ears 702 to threadedly engage with a retainer (not shown) attached to a bottom side of the PCB 4. The cover 74 defines a pair of threaded holes 740. A pair of parallel heat pipes 76 is received in the heat sink 7. Each heat pipe 76 generally has a U-shaped configuration. The heat pipes 76 comprise evaporating portions 760, condensing portions 762 parallel to the evaporating portions 760 and connecting portions 750 (shown in FIG. 4) perpendicularly connecting the evaporating portions 760 with the condensing portions 762. The evaporating portions 760 are received between the heat spreader 70 and a bottom portion 720 of the fins 72 such that the evaporating portions 760 and the heat spreader 70 are thermally connected together, which means heat received by the heat spreader 70 is immediately transferred to the evaporating portions 760. The condensing portions 762 are received between the cover 74 and a top portion 722 of the fins 72 such that the heat received by the evaporating portions 760 can be quickly transferred to the top portion 722 of the fins 72 via the condensing portions 762. The fan 6 is positioned on the heat spreader 70 and faces to a front side of the fins 72 such that an airflow generated by the fan 6 can enter channels 724 between the fins 72. The channels 724 extend along a front-to-rear direction. A width L of the fins 72 is smaller than that of the fan 6 so that a portion of the air flow generated by the fan 6 can detour round the heat sink 7 to directly blow MOSFETs (not shown) beside the CPU. The fan 6 has a square configuration, and comprises a top portion 60 and four corners 62. The top portion 60 is above a top portion of the cover 74. Each corner 62 defines an aperture 620.

Figure 2:
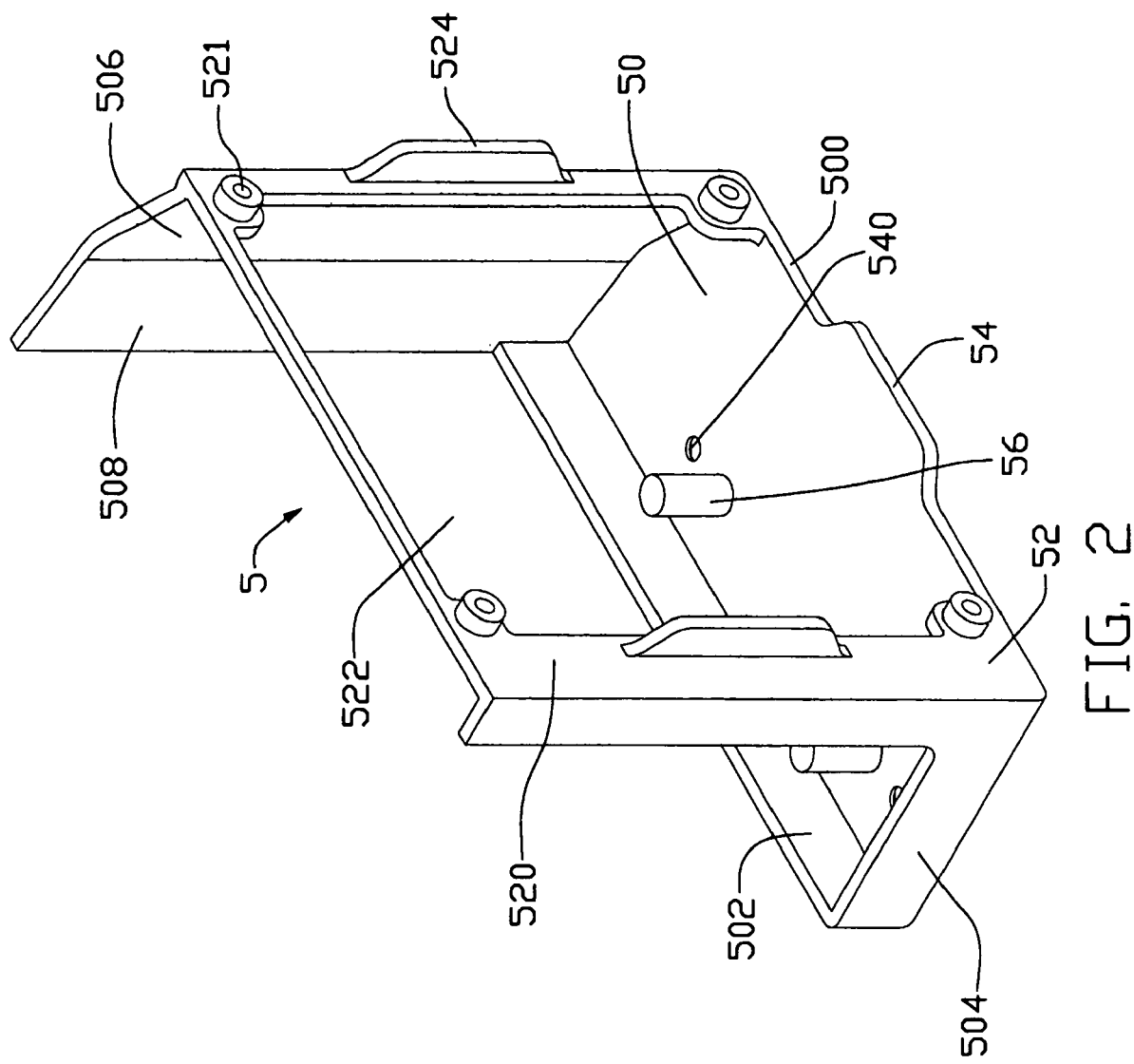
FIG. 2 is an enlarged perspective view of a fan duct of FIG. 1 from a different aspect.

Referring also to FIG. 2, the fan duct 5 in accordance with a first preferred embodiment of the present invention is formed by stamping and bending a single piece of metal. The fan duct 5 comprises a mounting plate 50 and a faceplate 52 extending from and perpendicular to the mounting plate 50. The mounting plate 50 forms a tab 54 extending horizontally from a centre of a front edge 500 of the mounting plate 50, and defines a pair of locating holes 540 corresponding to the threaded holes 740. The mounting plate 50 forms a pair of supporting rods 56 extending from a bottom thereof. Each of the supporting rods 56 has a substantially cylindrical shape. Adjoining first and second baffle plates 502, 504 extend from and perpendicular to the mounting plate 50, wherein the first baffle plate 502 extends from a rear side and the second baffle plate 504 extends from a lateral side of the mounting plate 50. Adjoining first and second baffle walls 506, 508 extend perpendicularly from another lateral side of the mounting plate 50, opposite the second baffle plate 504. The first and second baffle walls 506, 508 are located adjacent to the connecting portions 750 of the heat pipes 76 (better seen in FIG. 4). The first baffle wall 506 is at an angle to the second baffle wall 508 to prevent the fan duct 5 from interfering with the connecting portions 750 of the heat pipes 76. The faceplate 52 comprises a mounting face 520 defining four mounting holes 521 corresponding to the apertures 620 of the fan 6, respectively. The mounting face 520 is parallel to the first baffle plate 502. The faceplate 52 defines a central opening 522. The faceplate 52 forms a pair of lugs 524 perpendicularly extending from lateral sides of the faceplate 52 beside opening 522. The fan 6 is mounted to the mounting face 520 of the faceplate 52 by extending screws (not shown) through the apertures 620 of the fan 6 to screw into the mounting holes 521 of the faceplate 52. The fan 6 is positioned between the lugs 524 and blows the air flow through the opening 522 toward the heat sink 7.

Figure 3:
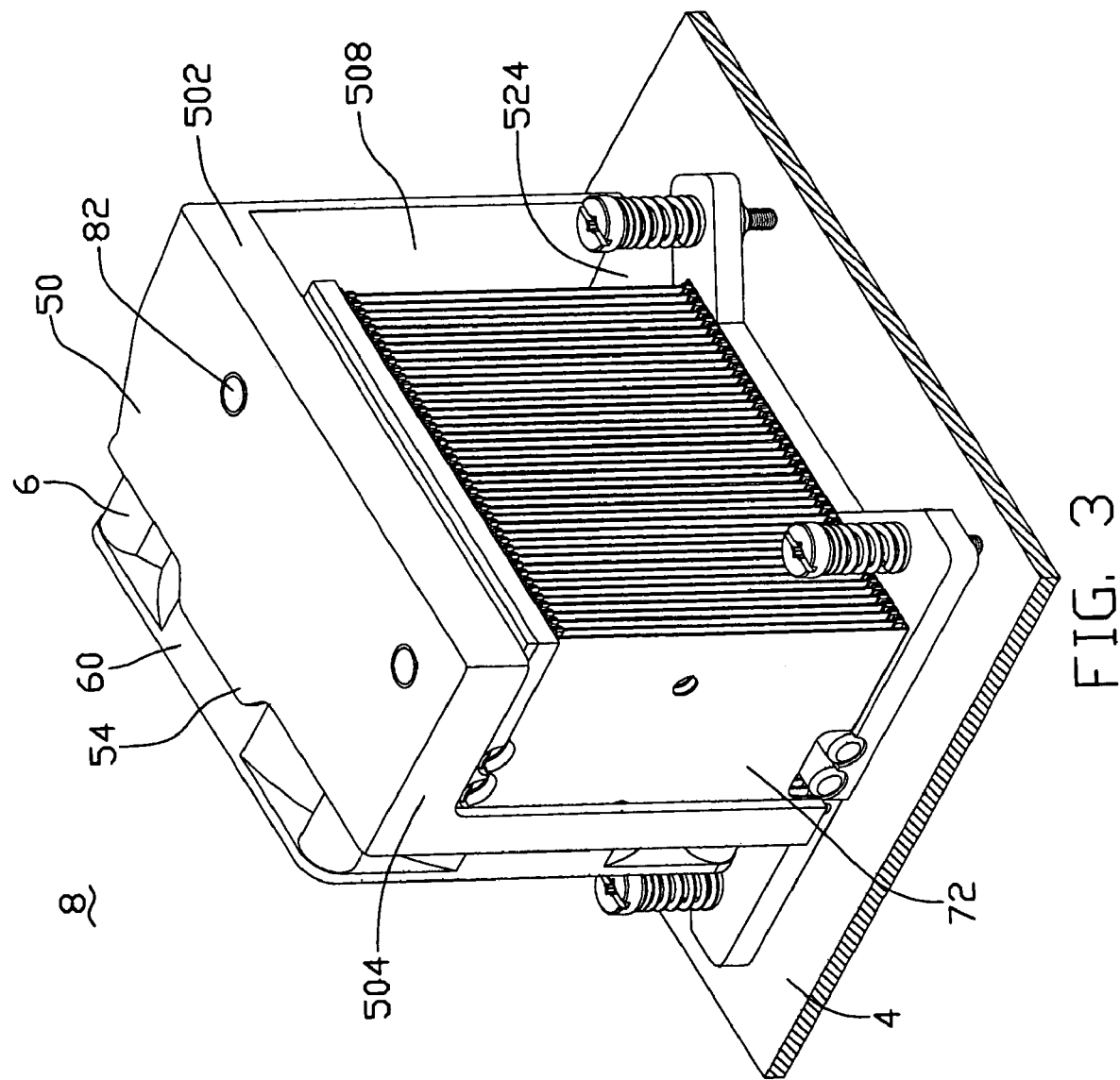
FIG. 3 is an assembled view of FIG. 1.
Figure 4:
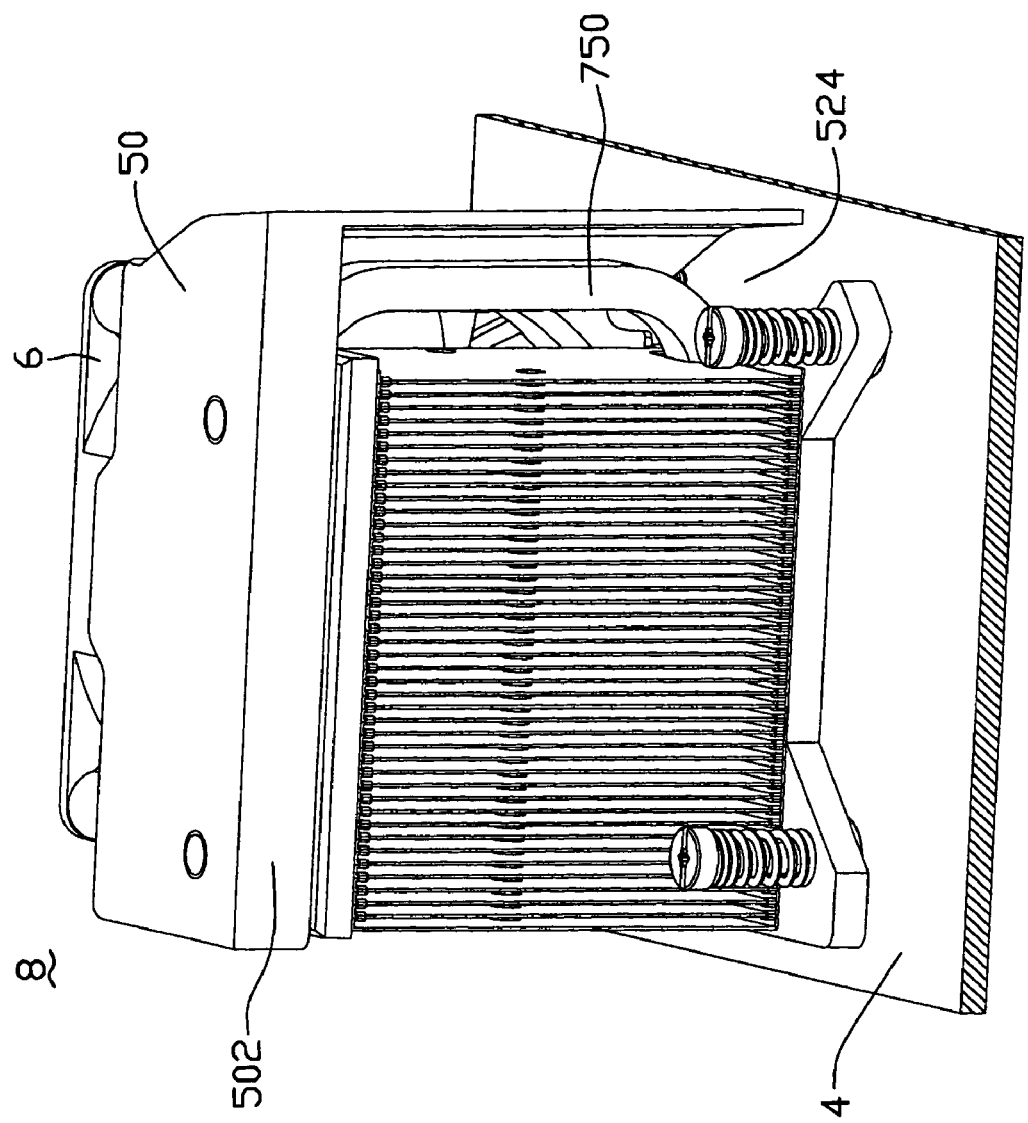
FIG. 4 is a view similar to FIG. 3, but shown from a different aspect.
Figure 5:
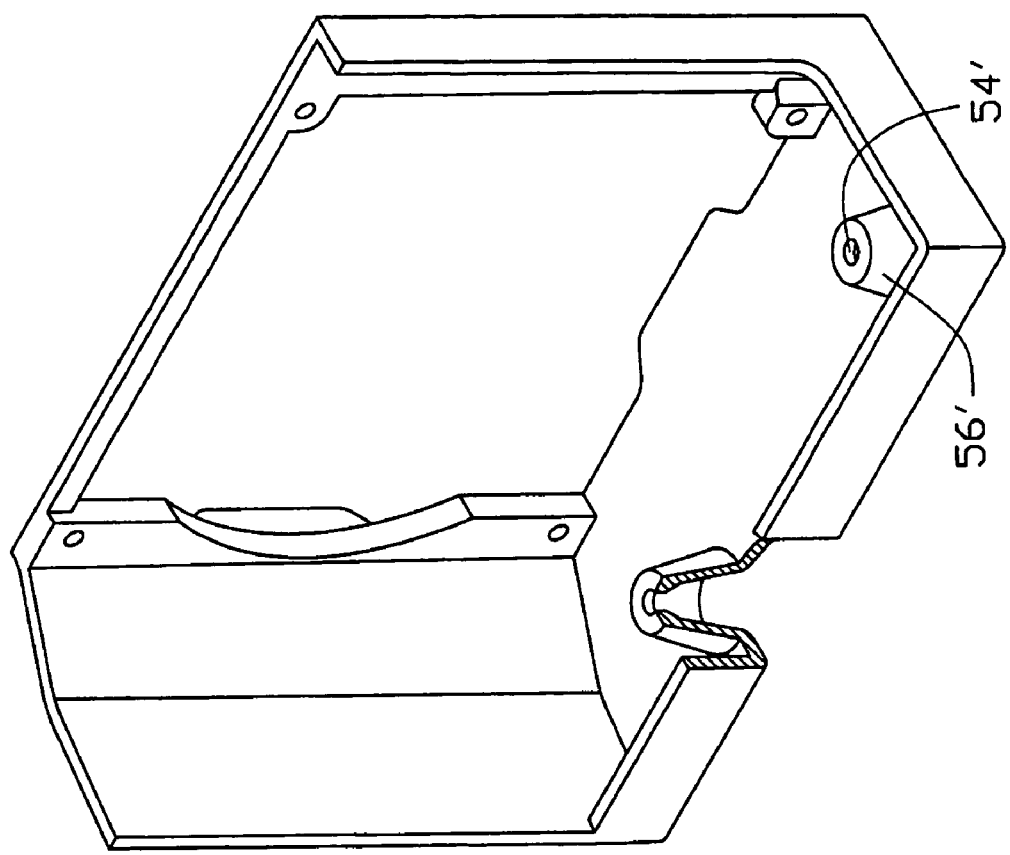
FIG. 5 is an enlarged perspective, partly cut-away view of a fan duct in accordance with a second preferred embodiment of the present invention.

Referring to FIGS. 1 and 3-4, the fan duct 5 is fixed to the heat sink 7 by extending two screws 82 through the two locating holes 540 defined in the mounting plate 50 to threadedly engage with the two threaded holes 740 defined in the cover 74 of the heat sink 7. The supporting rods 56 support the fan duct 5 against the cover 74 and functions as a spacer between the mounting plate 50 and the cover 74 so that a gap is formed between the mounting plate 50 and the cover 74. The tab 54 of the mounting plate 50 is positioned on the top portion 60 of the fan 6. The first and second baffle plates 502, 504 are positioned on the cover 74 for preventing the air flow generated by the fan 6 from flowing away from the top of the heat sink 7. The first and second baffle walls 506, 508 and the fin 72 adjacent to the connecting portions 750 of the heat pipes 76 form an outlet 524 for facilitating the portion of the air flow for blowing the MOSFETs (not shown) on the PCB 4 and dissipating the heat generated thereby to leave the heat dissipating device 8.

FIG. 4 shows a fan duct in accordance with a second preferred embodiment of the present invention. The fan duct of the second preferred embodiment is similar with that of the first preferred embodiment. However, two supporting rods 56' replace the supporting rods 56 of the first embodiment and locating holes 540' replaces the locating holes 540 of the first embodiment. Each of the supporting rods 56' has a substantially conic shape. Each locating hole 540' also has a substantially conic shape. The locating hole 540' is defined in a center of the supporting rod 56' through a bottom wall thereof.

When the fan 6 operates, one portion of the air flow generated by the fan 6 flows through the opening 522 to reach the fins 72. From the fins 7, the air flow takes the heat of the CPU away into the surrounding air. The fins 72 absorb the heat from the CPU. Accordingly, the heat generated by the CPU can be quickly dissipated. Another portion of the air flow generated by the fan 6 flows through the opening 522 and the outlet 524 to directly blow the MOSFETs beside the CPU. Accordingly, the heat generated by the MOSFETs can be quickly dissipated.

In disassembly of the fan duct 5 from the heat sink 7, the screws 82 are disengaged from the cover 74 and the mounting plate 50. The fan duct 5 with the fan 6 is then disassembled from the heat sink 7. According to the present invention, the fan duct 5 functions not only for guiding a portion of the air flow of the fan 6 towards the fins 72 and the MOSFETs, but also for mounting the fan 6 to the heat sink 7.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A fan duct assembly, comprising:
a heat sink having a plurality of parallel fins; and
a fan duct mounted to the heat sink, comprising a mounting plate having locating holes for screws extending therethrough, a faceplate extending downwardly from and perpendicular to the mounting plate, and a baffle wall extending downwardly from the mounting plate, the faceplate comprising a mounting face for a fan being mounted thereon and a central opening for air flow generated by the fan therethrough, the baffle wall and the heat sink forming an outlet through which the air flow of the fan flows, the air flow of the fan also flowing through the heat sink;
wherein a baffle plate parallel to the faceplate extends downwardly and perpendicular to the mounting plate for preventing the air flow from flowing away from the top of the heat sink, and the baffle plate and the faceplate are located at opposite flanks of the mounting plate.

2. The fan duct of claim 1, wherein the mounting plate forms supporting rods extending downwardly from a bottom thereof for supporting the fan duct on the heat sink.

3. The fan duct of claim 2, wherein the supporting rods each have a substantially cylindrical shape.

4. The fan duct of claim 2, wherein the supporting rods each have a substantially conic shape.

5. The fan duct of claim 1, wherein the heat sink comprises a heat spreader, the fins extending upwardly from the heat spreader and a cover parallel to the heat spreader disposed on the fins.

6. The fan duct of claim 5, wherein the cover defines threaded holes corresponding to the locating holes of the mounting plate for permitting the screws to engage with the threaded holes.

7. The fan duct of claim 1 further comprising heat pipes received in the heat sink.

8. The fan duct of claim 1, wherein the mounting plate forms a tab extending horizontally from an end thereof and disposed on a top of the fan.

9. The fan duct of claim 1, wherein the baffle wall connects the mounting plate and the faceplate, and the outlet is formed between the baffle wall and an outmost fin of the fins of the heat sink.

10. A heat dissipation device comprising:
a heat sink comprising a heat spreader, a cover parallel to the heat spreader and a plurality of fins disposed between the heat spreader and the cover, the cover having threaded holes defined therein;
a fan positioned on the heat spreader of the heat sink; and
a fan duct comprising a mounting plate, a faceplate extending downwardly from and perpendicular to the mounting plate, and a baffle wall extending downwardly from the mounting plate, the mounting plate comprising locating holes corresponding to the threaded holes of the cover and permitting screws to pass through the locating holes and to engage with the threaded holes of the cover, the mounting plate further comprising supporting rods extending downwardly from a bottom thereof and abutting against the cover to thereby form a gap between the mounting plate and the cover, the faceplate comprising a mounting face for the fan being mounted thereon and a central opening for an air flow generated by the fan therethrough, the baffle wall and the heat sink form an outlet through which the air flow generated by the fan flows, the air flow also flowing through channels between the fins.

11. The heat dissipation device of claim 10 further comprising a pair of parallel juxtaposed heat pipes received in the heat sink.

12. The heat dissipation device of claim 11, wherein the heat pipes comprise evaporating portions received between the heat spreader and a bottom portion of the fins, condensing portions received between the cover and a top portion of the fins, and connecting portions perpendicularly connecting the evaporating portions with the condensing portions.

13. The heat dissipation device of claim 12, wherein the baffle wall is adjacent to the connecting portions of the heat pipes.

14. The heat dissipation device of claim 13, wherein the outlet is formed between the baffle wall and one of the fins adjacent to the connecting portions of the heat pipes.

15. The heat dissipation device of claim 10, wherein the outlet is formed between the baffle wall and one of the fins adjacent to the connecting portions of the heat pipes.

16. A heat dissipating device comprising:
a heat spreader for contacting with a first heat-generating electronic device;
a plurality of fins on the heat spreader, said fins forming a plurality of channels therebetween, the channels extending along a front-to-rear direction;
a fan duct having a mounting plate mounted on a top of the fins, a faceplate on a front side of the fins and a baffle wall extending downwardly from a lateral side of the mounting plate;
a fan mounted on the faceplate of the fan duct, wherein an air flow generated by the fan has a portion flowing through the channels of the fins and another portion flowing between the fins and the baffle wall for blowing a second heat generating electronic device; and
a heat pipe having an evaporating portion mounted on the heat spreader a condensing portion mounted on the top of the fins, and a connecting portion interconnecting the evaporating portion and the condensing portion and located between the fins and the baffle wall;
wherein the mounting plate of the fan duct has a supporting rod thereon the supporting rod abutting against the top of the fins to form a gap between the top of the fins and the mounting plate, the fan duct further comprising first and second baffle plates extending downwardly from adjoining sides of the mounting plate and abutting against the top of the fins.

17. The heat dissipating device of claim 16, wherein the heat spreader has four ears through which four fasteners extend for engaging with a printed circuit board.

18. The heat dissipating device of claim 16, wherein the mounting plate has a forwardly extending tab, the tab abutting on a top of the fan.

* * * * *